United States Patent [19]
Yokosawa et al.

[11] Patent Number: 5,955,400
[45] Date of Patent: Sep. 21, 1999

[54] SQUID INTEGRATED WITH PICKUP COILS

[75] Inventors: Koichi Yokosawa, Kokubunji; Shinya Kuriki, Sapporo, both of Japan

[73] Assignee: Hitachi, Ltd., Tokyo, Japan

[21] Appl. No.: 08/904,544

[22] Filed: Aug. 4, 1997

[30] Foreign Application Priority Data

Aug. 2, 1996 [JP] Japan ................................. 8-204488

[51] Int. Cl.⁶ .................. G01R 33/035; H01L 39/22; H01F 6/06
[52] U.S. Cl. .................. 505/162; 257/33; 324/248
[58] Field of Search ................. 324/248; 257/31, 257/33, 34, 421; 505/162, 845, 846; 600/409; 336/DIG. 1

[56] References Cited

U.S. PATENT DOCUMENTS

| | | | |
|---|---|---|---|
| 4,694,567 | 9/1987 | Daalmans | 324/248 X |
| 5,548,130 | 8/1996 | Shimizu et al. | 324/248 X |

FOREIGN PATENT DOCUMENTS

| | | | |
|---|---|---|---|
| 4125087 | 2/1993 | Germany | 324/248 |

OTHER PUBLICATIONS

Romani et al; "Biomagnetic instrumentation", Rev. Sci. Instrum. 53(12), Dec. 1982 pp. 1815–1845.
Koelle et al; "dc SQUID magnetometers . . . of $YBa_2Cu_3O_{7-x}$", Appl. Phys. Lett. 63(16), Oct. 1993 pp. 2271–2273.
Drung et al; "Integrated $YBa_2Cu_3O_{7-x}$ magnetometer for biomagnetic measurements", Appl. Phys. Lett. 68(10), Mar. 4, 1996, pp. 1421–1423.
Ludwig et al; "High–Tc Multilayer Magnetometers with Improved l/f Noise", IEEE Trans. on Appld. Superconductivity, vol. 5, No. 2, Jun. 1995, pp. 2919–2922.
Cantor et al; "Low–Noise . . . DC SQUID Magnetometers at 77K", IEEE Trans. On Appl. Superconductivity, vol. 5, No. 2, Jun. 1995, pp. 2927–2930.
Enpuku et al; "Effect of thermal noise on . . . device" J. Appl. Phys. 73(11), Jun. 1993, pp. 7929–7934.
Daalmans et al; "Single Layer YBaCuO–Gradiometer", IEEE Trans. on Appl. Superconductivity, vol. 5, No. 2, Jun. 1995, pp. 3109–3112.
Yokosawa et al; "Design and fabrication . . . and SQUIDS", Rev. Sci. Instrum. vol. 65, No. 12, Dec. 1994, pp. 3814–3819.

*Primary Examiner*—Gerard Strecker
*Attorney, Agent, or Firm*—Antonelli, Terry, Stout & Kraus, LLP

[57] ABSTRACT

Pickup coils constructed by superconductors and a SQUID part are formed on a single substrate. The pickup coils are parallelly connected to two other superconductors (inductance of the SQUID ring) in a SQUID ring, which consists of two Josephson junctions and two superconductive lines. Each of the superconductors can be a superconductive line of one loop or a washer type coil. Each pickup coil occupies about one half of the area of the substrate and the SQUID and the pickup coils are symmetrical with respect to the center line of the substrate.

16 Claims, 12 Drawing Sheets

SQUID INTEGRATED WITH PICKUP COILS

BACKGROUND OF THE INVENTION

The present invention relates to a SQUID (superconducting quantum interference device) used for a magnetic sensor for measuring a biomagnetic field, and more particularly, to a technique suitable for a case where a SQUID and pickup coils are formed by using a high-Tc superconductor having superconductive characteristics in liquid nitrogen.

SQUID magnetometers used for measuring in the biomagnetic field are described in, for example, "Review of Scientific Instrument", Vol. 53, No. 12, pp. 1815–1845. The SQUID described in the literature is constructed by using a well-known metal superconductor using niobium (Nb), lead (Pb), or alloys there of as a main component and operates in liquid helium (4.2K) together with pickup coils. A SQUID using what is called a high-Tc superconductor made of $YBa_2CU_3O_y$ (YBCO) or the like which becomes superconductive in liquid nitrogen (77K) has been developed. Since the liquid nitrogen that is cheap and handled easily can be used as a cooling agent, the high-Tc SQUID is extremely useful for wide use as a biomagnetic field measuring device. In recent years, since the performance of the high-temperature SQUID is improved, the biomagnetic field can be also measured by a fluxmeter using the high-temperature SQUID.

Examples of the high-temperature SQUID fluxmeter are described in "Applied Physics Letter", Vol. 68, No. 10, pp. 1421–1423 (hereinbelow, referred to as a first example), "IEEE Transaction of Superconductivity", Vol. 5, No. 2, pp. 2919–2922 (hereinbelow, called a second example), "IEEE Transaction of Superconductivity", Vol. 5, No. 2, pp. 2927–2930 (hereinbelow, called a third example), "Applied Physics Letter", Vol. 63, No. 16, pp 2271–2273 (hereinbelow, called a fourth example), and the like.

Like all of the first to fourth examples, a dc-SQUID, that is, a superconductive ring having two Josephson junctions is considered as the SQUID here. FIGS. 10 and 11 show current versus voltage characteristics and flux to voltage conversion characteristics of a well-known SQUID. In FIG. 10, $\Phi_{ex}$ is a magnetic flux applied to the SQUID, $\Phi_o$ is fluxoid quantum, Ib is a bias current value giving the flux to voltage conversion characteristics, and n is an integer. FIG. 10 shows a state such that a step occurs when $\Phi_{ex}$ is $(n+\frac{1}{2})\Phi_o$ due to resonance of a microwave generated depending on the ring shape of the SQUID. It is known that a voltage amplitude $\Delta V$ is regulated due to the step.

In a manner similar to a metal SQUID, the high-temperature SQUID is formed on a substrate. As shown in the first to fourth examples, the detection coil is also generally formed on the same substrate. One of reasons for the construction is that it is difficult to join high-temperature superconductors as compared with a metal superconductor and it is cult to separately fabricate a SQUID and a detection coil and join them in a manner similar to a fluxmeter using a metal superconductor. It is not always easy to form high-temperature superconductive multilayer films on a substrate. If both of the SQUID and the detection coil can be formed by a single high-temperature superconductor layer as shown in the third and fourth examples, the fabrication becomes much easier and the yield is also improved.

The SQUID fluxmeter in the third or fourth example is called a direct-coupling SQUID. FIG. 5 shows a configuration of the fluxmeter and FIG. 6 shows an example of a construction of a substrate on which the SQUID and the detection coil are mounted. FIG. 6a corresponds to a part 10 surrounded by a dotted line in FIG. 5. A hatched part is a superconductive film part and the rest is a part the substrate is exposed. FIG. 6b is an enlarged diagram of a SQUID part (*1) surrounded by a circle in FIG. 6a. A SQUID ring is a superconductive ring comprising two Josephson junctions 1 and superconductors 2, 2' for connecting the Josephson junctions 1. A direct-coupling SQUID has a construction that a detection coil 3 is parallelly connected to the supercoductor 2 constructing the SQUID ring. The Josephson junctions of the high-temperature SQUID are often formed in a bicrystal part (discontinuous part in a crystal direction) of a substrate represented by $SrTiO_3$ or a step edge part (step part). Since a bicrystal line 5 is generally positioned in the center of the substrate, the example of FIG. 6 has a construction that the SQUID and the detection coil are asymmetric. In FIG. 6a, reference numeral 6 denotes a pad for connection. In FIG. 5, reference numeral 20 denotes an amplifier, reference numeral 30 denotes a Flux-Locked-Loop circuit, and reference numeral 40 denotes a bias current source.

In the direct-coupling,SQUID, as described in the third example, when a noise $\Phi_n$ the fluxmeter is a flux noise of a SQUID input conversion a magnetic noise of a detection coil input conversion corresponding to sensitivity of the fluxmeter is shown by $\Phi n/A_{eff}$. $A_{eff}$ denotes a magnetic field detecting area of the detection coil which is approximately given by $A_p(L_c/L_p)$ where $A_p$ is an effective area of the pickup coil, $L_p$ is an inductance of the pickup coil, $L_c$ is a component contributing the magnetic coupling with pickup coil among all of inductances Ls of the SQUID ring, and $L_c<L_s$. It is known that the flux noise $\Phi_n$ of the SQUID input conversion is reduced as the voltage modulation $\Delta V$ of the flux to voltage conversion characteristics of the SQUID becomes larger.

SUMMARY OF THE INVENTION

It is an object of the invention to realize high sensitivity of a magnetometer in a direct-coupling SQUID in which a SQUID and pickup coils are formed on a single substrate. The realization of the high sensitivity is achieved by reducing the magnetic field noise $\Phi_n/A_{eff}$ of a pickup coil input conversion.

As mentioned above, in order to reduce the magnetic noise $\Phi_n/A_{eff}$ of the pickup coil input conversion, it is sufficient to enlarge a magnetic field detection area $A_{eff}$ of a magnetometer expressed by $A_p(L_c/L_p)$ or to reduce a flux noise $\Phi_n$ of a SQUID input conversion. In the invention, both of them are simultaneously realized. A construction realizing them and an operation will be described hereinbelow. In order to enlarge the magnetic field detection area $A_{eff}$ of the magnetometer, although it is sufficient to enlarge an effective area $A_p$ of the detection coil, it is limited by the area of the substrate. Consequently, in the direct-coupling SQUID using a substrate which has a predetermined area, it is sufficient to increase $L_c/L_p$. As it is known from "Journal of Applied Physics", Vol. 73, No. 11, pp. 7929–7934, and the like, the inductance Ls of the SQUID is also limited. As $L_s$ is increased, $\Delta V$ is reduced, so that Ls cannot be increased excessively. Therefore, it is sufficient to increase the proportion of the component $L_c$, among all of the inductances of the SQUID ring, which contributes to the magnetic coupling with the pickup coils as much as possible.

In the conventional construction, for example as shown in FIG. 6, among all of inductances of the SQUID ring shown in FIG. 6, only the part 2 lower than the Josephson junction contributes to the magnetic coupling with the pickup coil and the upper part 2' does not contribute to the magnetic coupling with the pickup coil. According to the construction of the invention, as shown in FIG. 1, pick coils are connected to both of the superconductive lines 2, 2' connecting the Josephson junctions in the SQUID ring. In the construction, among the inductances of the SQUID ring, all of them except the Josephson junction parts 1 contributes to the magnetic coupling with pickup coils, so that $L_c/L_s$ is increased and the magnetic field detection area $A_{eff}$ of the magnetometer is enlarged.

According to the construction, the SQUID and the pickup coils can be formed symmetrical with respect to the Josephson junctions. FIGS. 3 and 4 show construction examples of the substrate according to the invention. FIG. 6 shows a construction example of a conventional substrate. It is understood that a SQUID ring has a symmetrical shape with respect to a dotted line connecting the two Josephson junctions in the construction of the invention and the following effects can be consequently obtained. As described in the third example, a voltage $V_s$ of a step occurring in the current versus voltage characteristics by the resonance of the microwave is obtained from Equation 1.

$$V_s = c\Phi_o\{\sqrt{(2/(\epsilon_r+1))}\}/(4d)$$

where, c is a velocity of light, $\epsilon_r$ is a dielectric constant of the substrate, and d is a length for determining the wavelength of the microwave and can be approximated by the length between the Josephson junction and the SQUID ring. When the shape of the SQUID is rectangular as shown in FIGS. 3, 4, and 6, the inductance $L_s$ of the SQUID ring is substantially determined by the length of the long side of the hole of the SQUID ring. When it is assumed that the inductances $L_s$ are the same in FIGS. 6, 3 and 4, it can be considered that the length of the long side of the hole is the same in FIGS. 6, 3, and 4. Since the Josephson junctions in each of FIGS. 3 and 4 are positioned in the center of the long side of the hole, it can be considered that the length between the Josephson junction and the SQUID ring edge is almost the half of that in case of FIG. 6. It can be consequently considered that by using the Equation 1, the voltage $V_s$ of the step occurring in the current versus voltage characteristics of each of the SQUIDs shown in FIGS. 3 and 4 can be expected to be about twice as high as that in case of the conventional SQUID. As obviously understood from FIGS. 10 and 11, as the step voltage becomes higher, the voltage modulation $\Delta V$ increases and the flux noise $\Phi_n$ of the SQUID input conversion is reduced, so that the magnetic field noise $\Phi_n/A_{eff}$ of the pickup coil input conversion can be reduced.

As mentioned above, when the SQUID and the pickup coils of the SQUID magnetometer are integrally formed by especially using a one-layer of a high-Tc superconducting film, by using two pickup coils and, each of them occupying half the area of the substrate, the magnetic field detection area of the pickup coils can be enlarged, the flux noise of the SQUID input conversion can be reduced, and the magnetic field noise of the pickup coil input conversion can be reduced.

The invention will be summarized hereinbelow. Pickup coils each of which occupying half the area of the substrate are connected to two superconductive lines connecting Josephson junctions of a SQUID ring, respectively, and the SQUID and the pickup coils are formed symmetrical with respect to the center line of the substrate face. The effective area of the pickup coils is proportional to components contributing to the magnetic coupling with the pickup coils among inductances of the SQUID ring. According to the construction of the invention, therefore, since all of the inductances of the SQUID ring other than the Josephson junctions contribute to the magnetic coupling with the pickup coils, a magnetic field detection area of the pickup coils is enlarged. The influence by the microwave step of the SQUID is reduced by symmetry of the shape and voltage modulation of the SQUID is improved. By the above two effects, the magnetic field noise of the pickup coil input conversion of the SQUID magnetometer is reduced.

The outline of the embodiment of the invention will be described hereinbelow. According to a SQUID integrated with pickup coils, in a SQUID ring formed by connecting two Josephson junctions by two first superconductors, there are provided second superconductors connected to the first superconductors connecting the Josephson junctions in a one-to-one manner and the first and second superconductors form a plurality of closed superconductive circuits. A plurality of the second superconductors can be also connected to each of the two first superconductors. Each of the second superconductors can form a closed superconductive circuit with the first superconductor. The second superconductors correspond to pickup coils which will be described below. There can be also provided a third superconductor which can be magnetically coupled to at least one of the plurality of closed superconductive circuits or third and fourth superconductors magnetically coupled to at least one of the plurality of the closed superconductive circuits.

A SQUID and pickup coils are formed in a thin one-layer superconductive film on a single substrate. The SQUID and the pickup coils are formed by a high-Tc superconductive film having superconductive characteristics at an absolute temperature of 77 Kelvin. The center of the substrate face is placed inside of the hole of the SQUID ring, and the SQUID and pickup coils have a symmetrical shape in the substrate face with respect to at least a line in the substrate face including the center of the substrate face. For example, the substrate on which the SQUID and the pickup coils are formed is a bicrystal substrate having a misalignment in a crystal direction, the Josephson junctions are formed on a bicrystal line defined as a crossed line between the misalignment face in the crystal direction and the rate face. The SQUID and the pickup coils are symmetrical with respect to the bicrystal line. The substrate can also be a substrate having a step on the surface and the Josephson junctions can be formed on the step edge line. The SQUID and the pickup coils have a symmetrical shape in the substrate face with respect to the step edge line defined as an angle of the step.

In the above SQUID and the pickup coils, the plurality of closed superconductive circuits constructed by the first and second superconductors are used as pickup coils for detecting a magnetic field, and the third superconductor is used as a coil which is connected to a known flux-locked loop and feeds back a feedback flux of the flux-locked loop to the SQUID and the pickup coils, thereby constructing a magnetometer. Further, there is provided a magnetic gradiometer which consists of two SQUID and magnetometers mentioned above. The third superconductor of each magnetometer is used as a coil which is connected to a known flux-locked loop, and feeds back a feedback flux of the flux-locked loop to the SQUID and the detection coils of each magnetometer, wherein the third superconductor of the first magnetometer is serially connected to the fourth superconductor of the other magnetometer. A magnetic gradiometer system can be constructed by using a plurality of such magnetometers.

BRIEF DESCRIPTION OF THE DRAWINGS

FIG. 3b is a detailed diagram of a part of FIG. 3a;

FIG. 4b is a detailed diagram of a part of FIG. 4a;

FIG. 6b is a detailed diagram of a part of FIG. 6a;

DETAILED DESCRIPTION OF PREFERRED EMBODIMENTS

Figure 1:
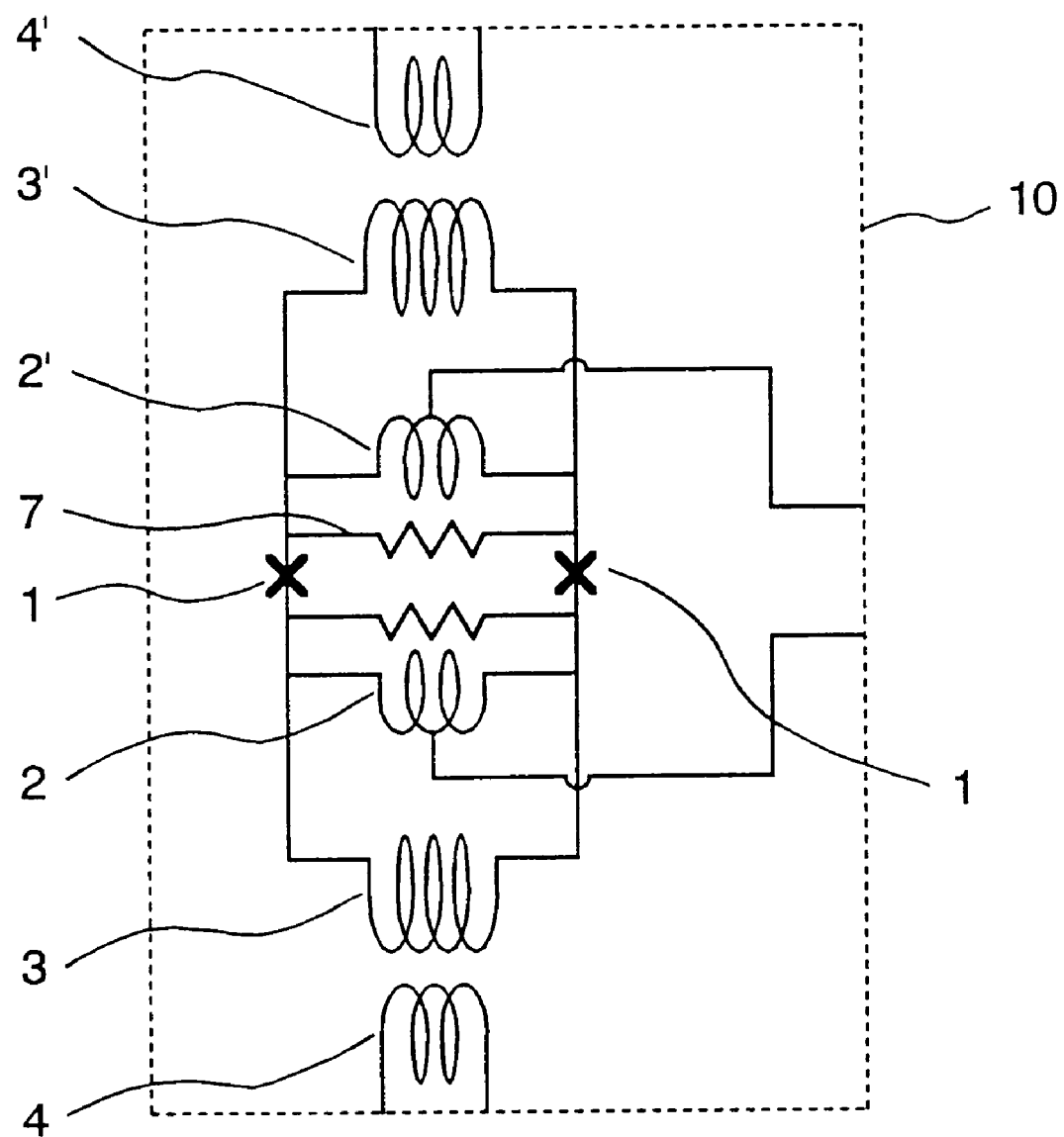
FIG. 1 is a diagram showing an equivalent circuit of an embodiment of the invention.
Figure 5:
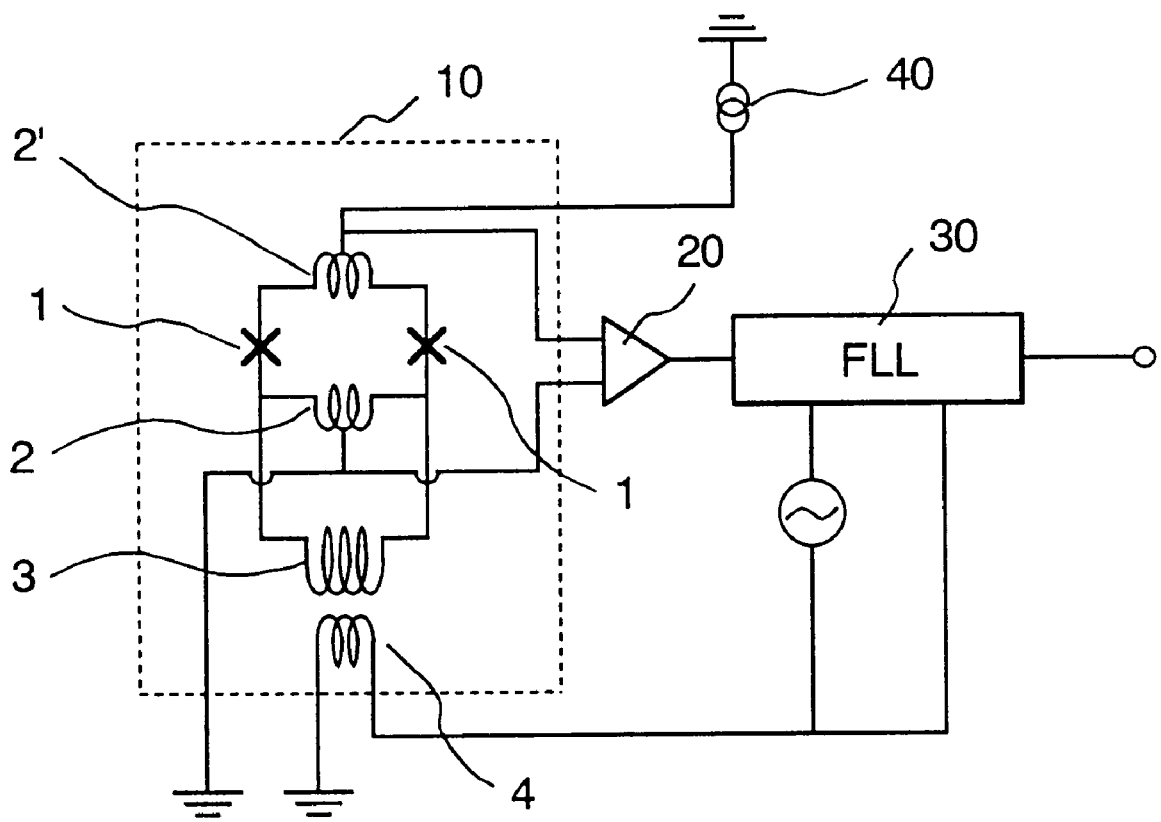
FIG. 5 is a diagram showing a conventional equivalent circuit.

FIG. 1 is a diagram showing an equivalent circuit according to an embodiment of the invention. FIG. 1 shows detection coils and a SQUID part formed on one substrate and corresponds to a substrate part 10 surrounded by a dotted line in the conventional circuit shown in FIG. 5. A SQUID ring is constructed by two superconductors (inductances of the SQUID ring) 2, 2' connecting two Josephson junctions 1. Although each of the superconductors 2, 2' has an inductance, they do not have to have a coil shape. Other superconductors (detection coils) 3, 3' are respectively, connected in parallel to the superconductors 2, 2'. The superconductors 2 and 3 form one closed superconductive circuit, and the superconductors 2' and 3' form another closed superconductor circuit. Although each of the superconductors 3, 3' also has an inductance, it can be a superconductive wire of a single loop or a washer-type coil which is conventionally well known. Reference numerals 4, 4' denote feedback coils and 7 indicates a damping resistance.

Figure 3A:
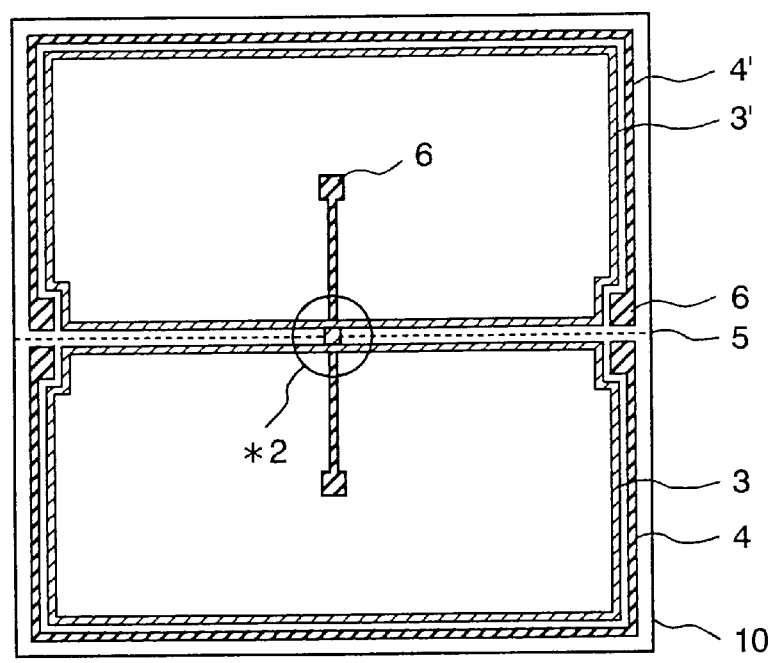
FIG. 3a is a diagram showing an example of a configuration of the substrate of the invention.
Figure 3B:
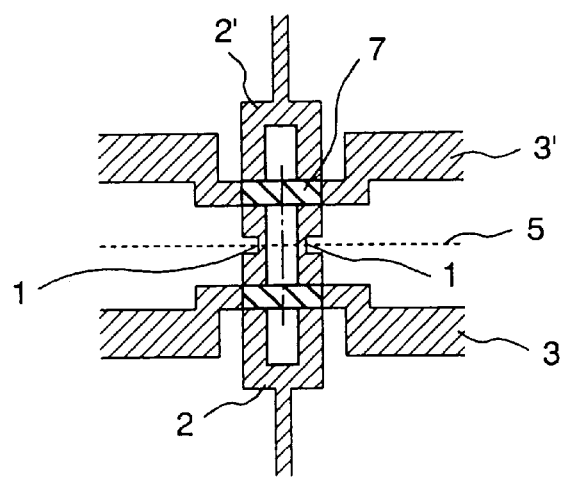
Figure 6A:
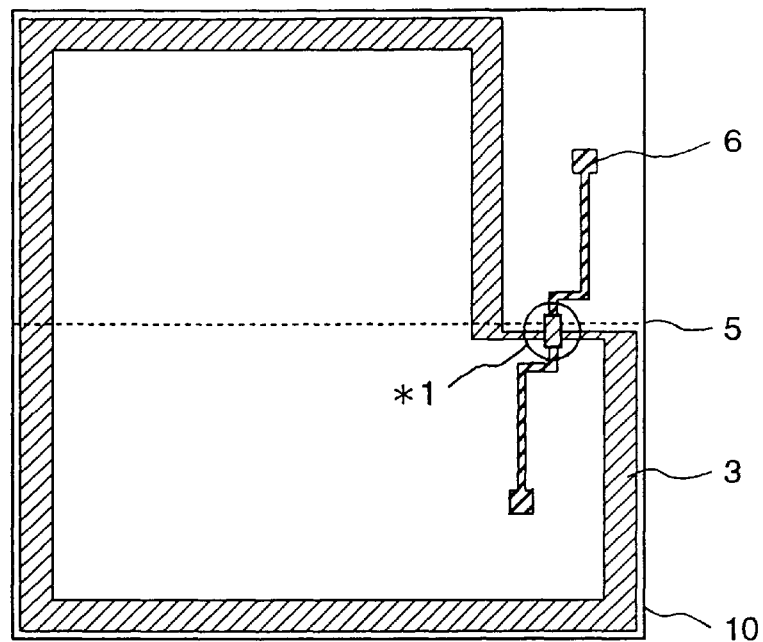
FIG. 6a is an example of a configuration of a conventional substrate.
Figure 6B:
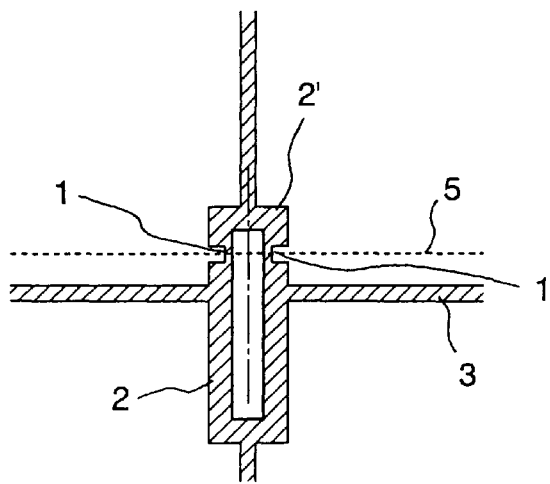

FIGS. 3 and 4 show specific construction examples of a substrate on which the detection coils and the SQUID are mounted. The detection coils and the SQUID are formed by a single layer of $YBa_2Cu_3O_y$ (YBCO) on a 15 cm×15 cm bicrystal substrate of $SrTiO_3$ (STO). In a manner similar to FIG. 6, the hatched part in each of FIGS. 3 and 4 shows a part of the superconductive layer and the rest shows a part that the substrate is exposed. FIG. 3a is a diagram showing the whole substrate on which the detection coils and the SQUID are mounted. Since an area occupied by the SQUID part shown by a circle is small, an enlarged diagram of the SQUID part (*2) is shown in FIG. 3b. The SQUID ring is shown by a a vertically-long rectangle having a hole. there is a necking in the superconductors on a bicrystal line 5. The necking is the Josephson junction part. Upper and lower superconductors of the Josephson junction in FIG. 3 correspond to the two superconductors 2, 2' connecting the Josephson junction. The reference numeral 7 denotes the damping resistance and is formed by a metal such as Au. A terminal for receiving a bias current and a terminal for generating a signal voltage are extended from the SQUID ring and are connected to pads 6. In the example shown in FIG. 3, the detection coils 3, 3' are superconductive layers each having the thickness of 300μm The feedback coils 4, 4' for applying a feedback magnetic flux and the like are provided on the outside of the detection coils 3, 3'. Each of the feedback coils 4, 4' is also a superconductive layer having the thickness of 300 μm. The detection coils 3, 3' and the SQUID are symmetrical with respect to the center of the substrate 10. No deterioration occurs in the flux to voltage conversion characteristics due to asymmetry of the shape. As understood by comparing with FIG. 6a, the detection coils 3, 3' occupy almost the whole face of the substrate 10, so that the effective area is large.

Figure 4A:
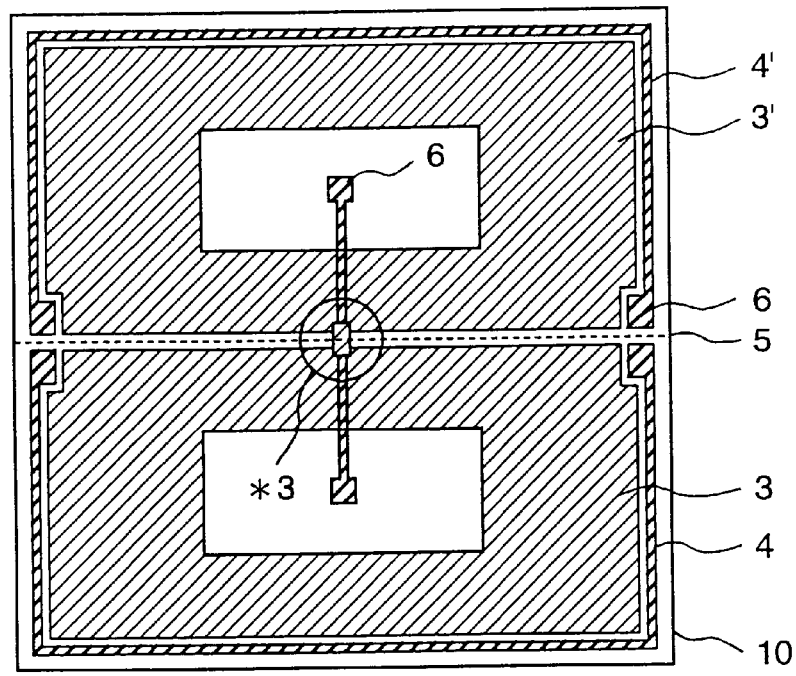
FIG. 4a is a diagram showing an example of a configuration of the substrate of the invention.
Figure 4B:
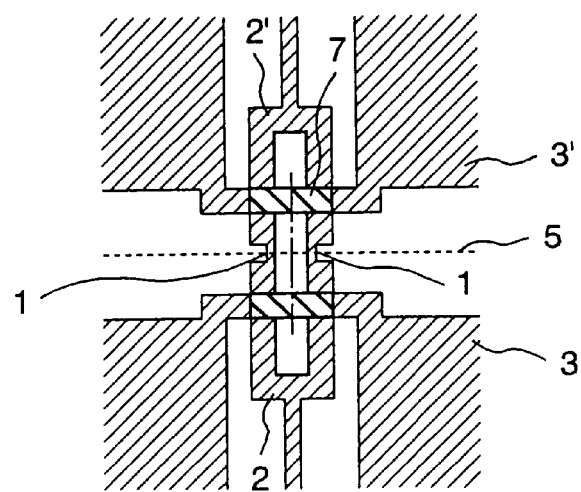

Although the shapes of the detection coils 3, 3' in FIG. 4 are different from those in FIG. 3, the equivalent circuit is similarity shown by FIG. 1. Each of the detection coils 3, 3' is of so-called a washer-ring type having a hole of 2.5 mm×5 mm in the center. According to the shape of the washer-ring type, although an effective area $A_p$ of the detection coils 3, 3' is smaller as compared with that in FIG. 3, a fact that an inductance $L_p$ of the detection coils 3, 3' is smaller than that in FIG. 3 is used to assure a magnetic field detection area $A_p$ ($L_c/L_p$) of the detection coil. FIG. 4a is a diagram showing the whole substrate on which the pickup coils and the SQUID are mounted. Since an area occupied by the SQUID part shown by a circle is small, an enlarged diagram of the SQUID part (*3) is shown in FIG. 4b. Although the examples have been described above by specifically describing the materials and numerical values, the materials and the numerical values are examples, and effects of the invention can be obtained even if they are different.

Figure 7:
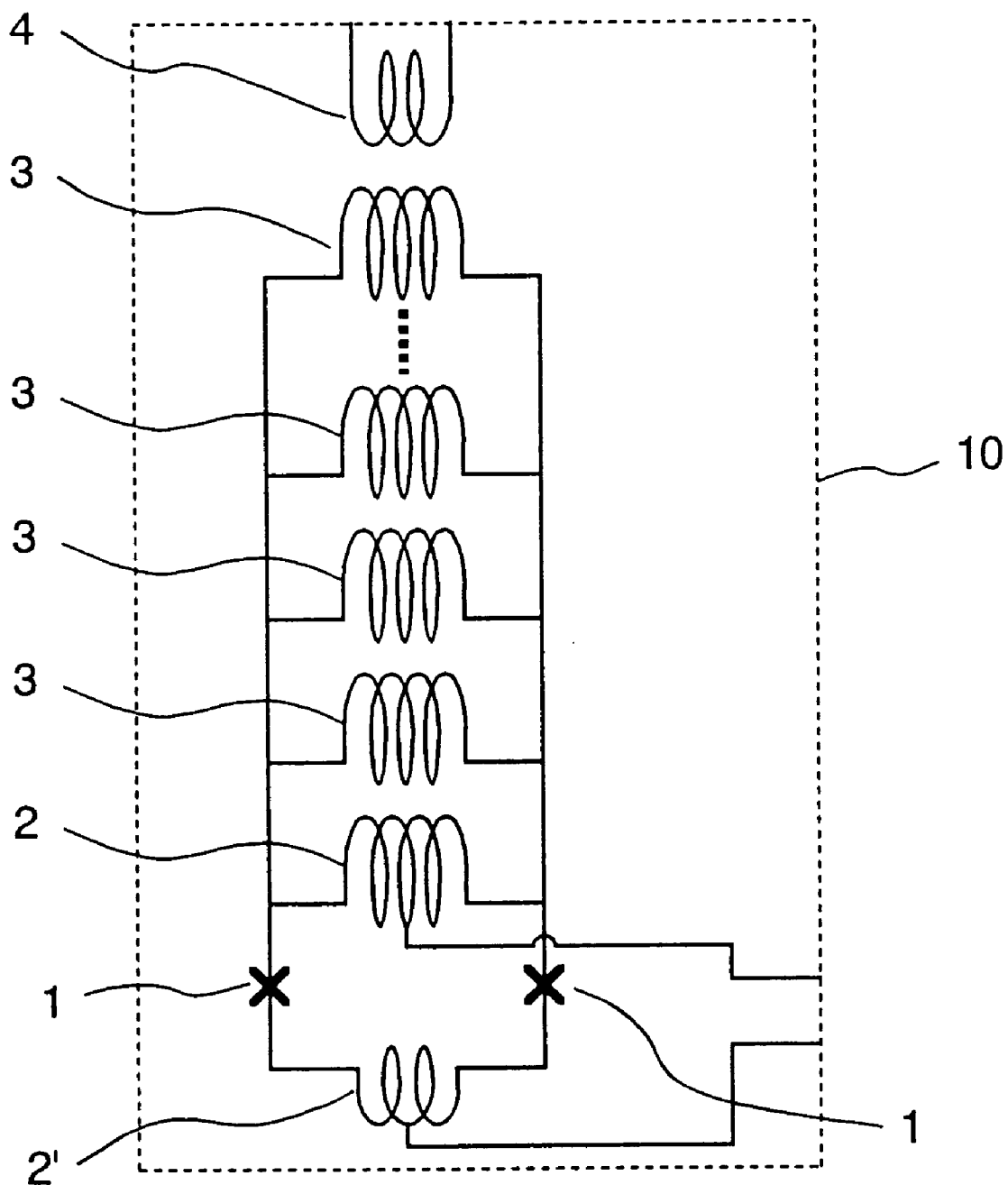
FIG. 7 is a diagram showing a conventional equivalent circuit.
Figure 8:
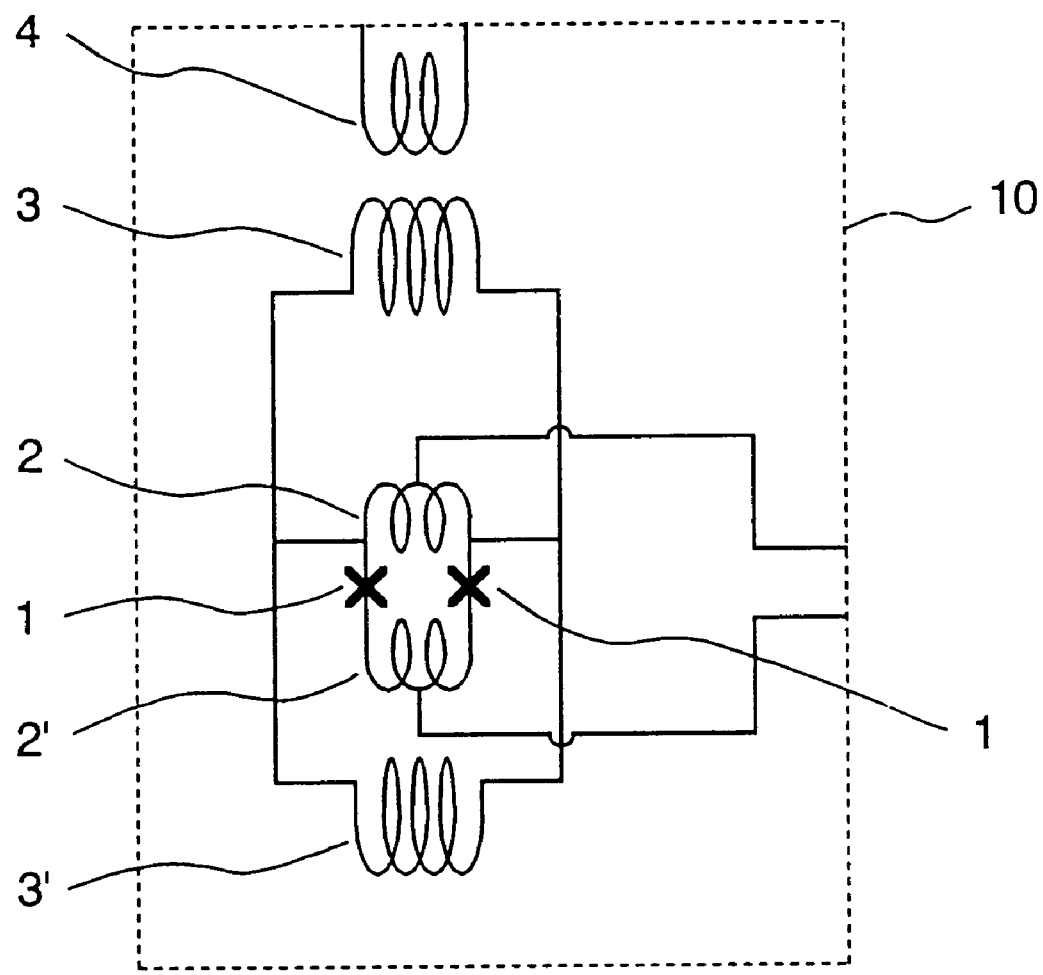
FIG. 8 is a diagram showing a conventional equivalent circuit.

There are known conventional constructions in which the pickup coils and the SQUID are integrated and which are similar to the construction of the invention. The invention is compared with them and the difference will be made clear. FIG. 7 is a diagram showing an equivalent circuit of the second example described in the conventional technique. A plurality of pickup coils 3 mounted on a single substrate 10 are parallelly connected to the SQUID. The construction intends to directly measure a magnetic field by the SQUID ring itself. In the example, it can be considered that each of the superconductors 2 constructing the SQUID ring and each of the pickup coils 3 are the same with respect to the shape and inductance. In order to reduce the inductance of the SQUID ring as much as possible, the plurality of pickup coils 3 are parallelly connected to the SQUID. As obviously understood from the comparison between FIGS. 1 and 7, the following point is different. The pickup coils 3, 3' are parallelly connected to the superconductors (inductances of the SQUID ring) 2, 2' in a one-to-one manner in FIG. 1. On the other hand, in FIG. 7, the plurality of pickup coils 3 are parallelly connected to the superconductor 2 responding to the superconductor 2' in FIG. 1) and another superconductor is not connected to the lower superconductor 2' (corresponding to the superconductor 2 in FIG. 1). FIG. 8 is a diagram showing a conventional equivalent circuit described in "IEEE Transaction of Superconductivity", Vol. 5, No. 2, pp. 3109–3112. According to the example, two pickup coils 3, 3' parallelly connected are connected to only one (2) of superconductors which connect Josephson junctions 1. The example has a construction such that the two pickup coils 3, 3' detect a spacial differential magnetic field. As obviously understood from the comparison between FIGS. 1 and 8, in the example of FIG. 8 as well, the point the pickup coils 3, 3' are connected to only one (2) of the superconductors connecting the Josephson junctions 1 and no detection coils are connected to the other superconductor (2') is different from the invention.

Figure 12A:
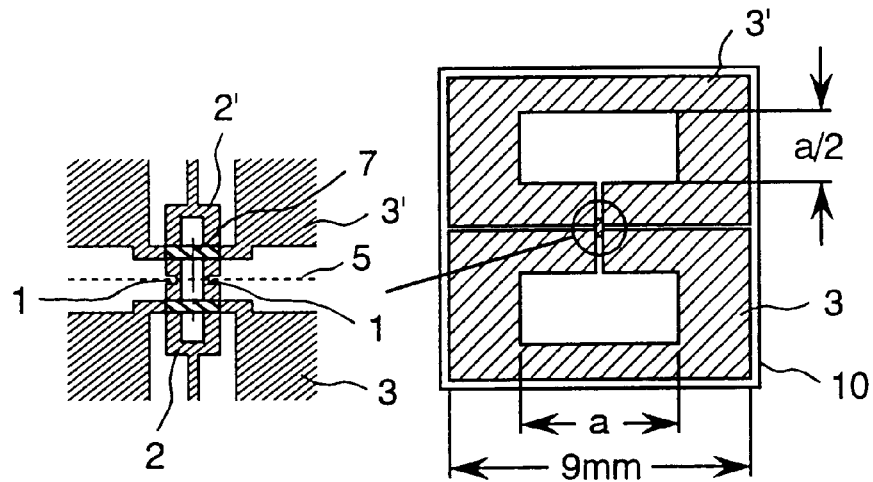
FIGS. 12a and 12b are diagrams showing configurations of a direct-coupling high-Tc SQUID magnetometer having two pickup coils equally dividing a substrate according to an embodiment of the invention.
Figure 12B:
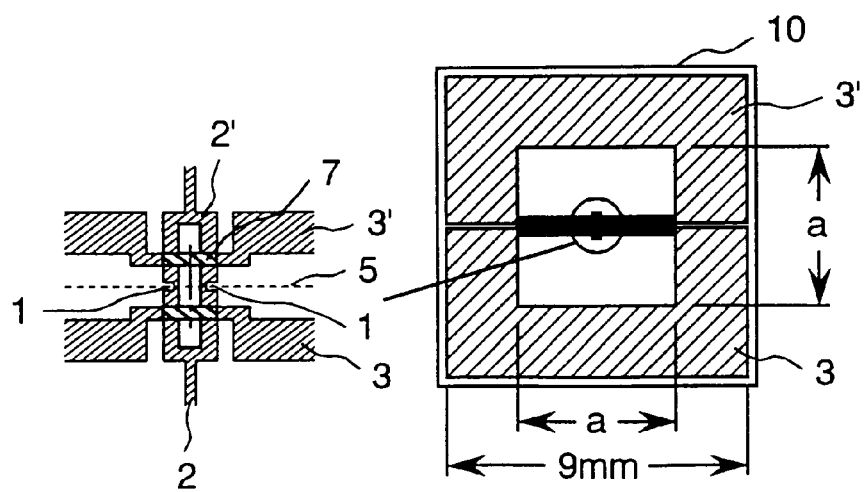
Figure 13:
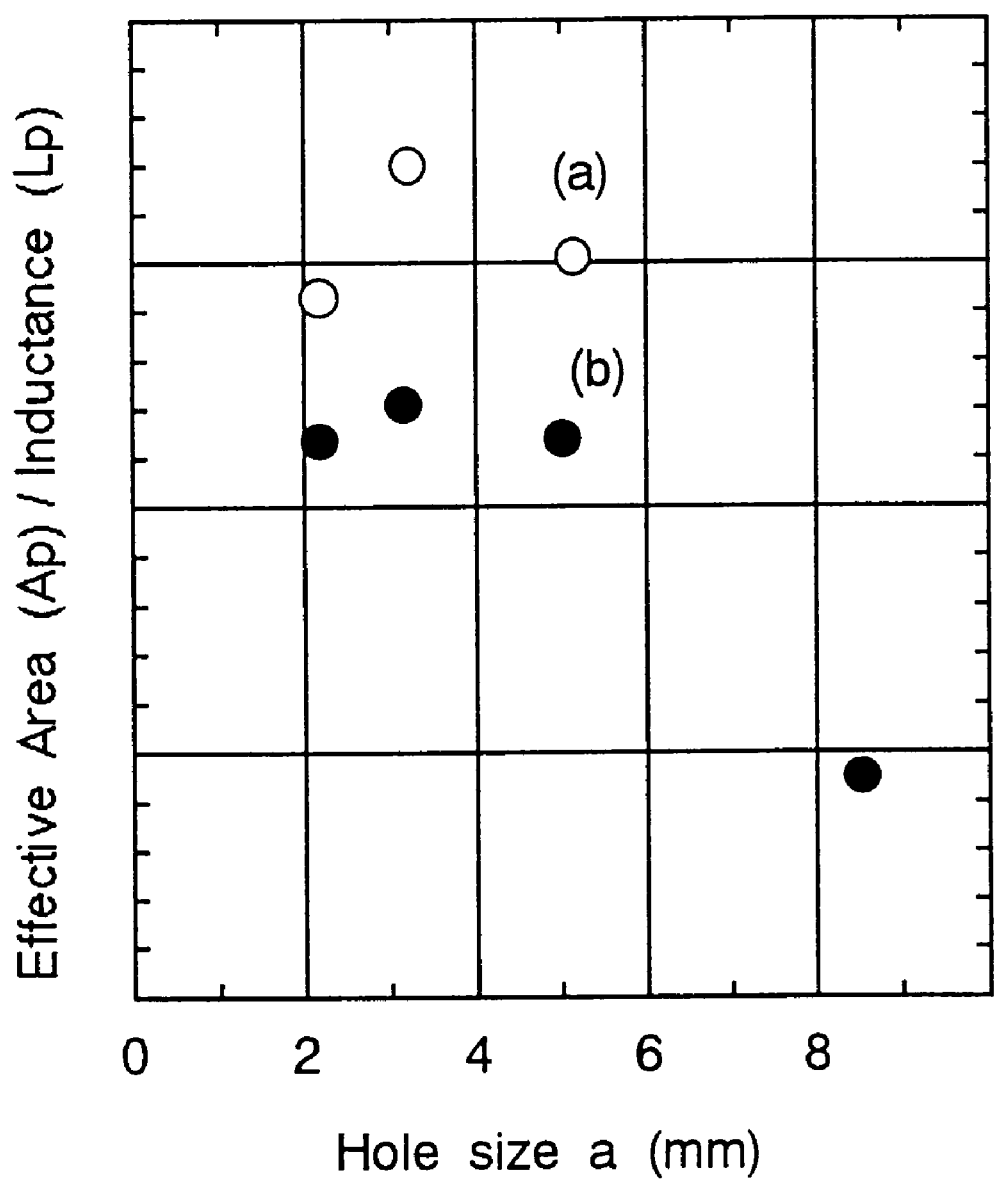
FIG. 13 is a diagram showing characteristics of a SQUID fluxmeter having the construction shown in FIGS. 12a and 12b.

A specific construction of the direct-coupling high-Tc SQUID magnetometer and experimental results will be described. In a construction having two detection coils equally dividing a substrate area as shown in FIG. 12, all of SQUID inductances $L_c$ except the Josephson junctions 1 part contribute to the magnetic coupling with the pickup coils 3, 3', so that the magnetic field detection area is large. Further, the SQUID and the pickup coils 3, 3' are symmetrically arranged with respect to the bicrystal line 5. Models of the pickup coils 3, 3' having the constructions shown in FIGS. 12a and 12b are fabricated by setting the substrate size of 9 mm×9 mm and changing the hole size a (mm), and the inductances $L_p$ of the pickup coils are measured. Each of the models is fabricated by forming a two-layer film of Ni and Au on a substrate made of glass epoxy resin. In the actual SQUID magnetometer, the glass epoxy resin substrate and the two-layer film correspond to a bicrystal substrate of $SrTiO_3$ (STO) and a superconductive film of $YBa_2CU_3O_y$ (YBCO), respectively. FIG. 13 shows results of plotting the ratio ($A_p/L_p$), where Ap denotes the effective area, and Lp denotes the inductance of the pickup coil with the hole size of a (mm). In FIG. 13, (a) and (b) show results obtained from the models having the constructions shown in FIGS. 12a and 12b, respectively. The ratio ($A_p/L_p$) of the construction shown in FIG. 12a is larger than that of the construction shown in FIG. 12b. Further, in the construction shown in FIG. 12(a), when the substrate size of the pickup coil is 9 mm×9 mm, although the same ordered values of ($A_p/L_p$) were obtained in a range where the hole size is from 2 mm to 5 mm, it was found that the hole size a=3 mm is the best.

Figure 2:
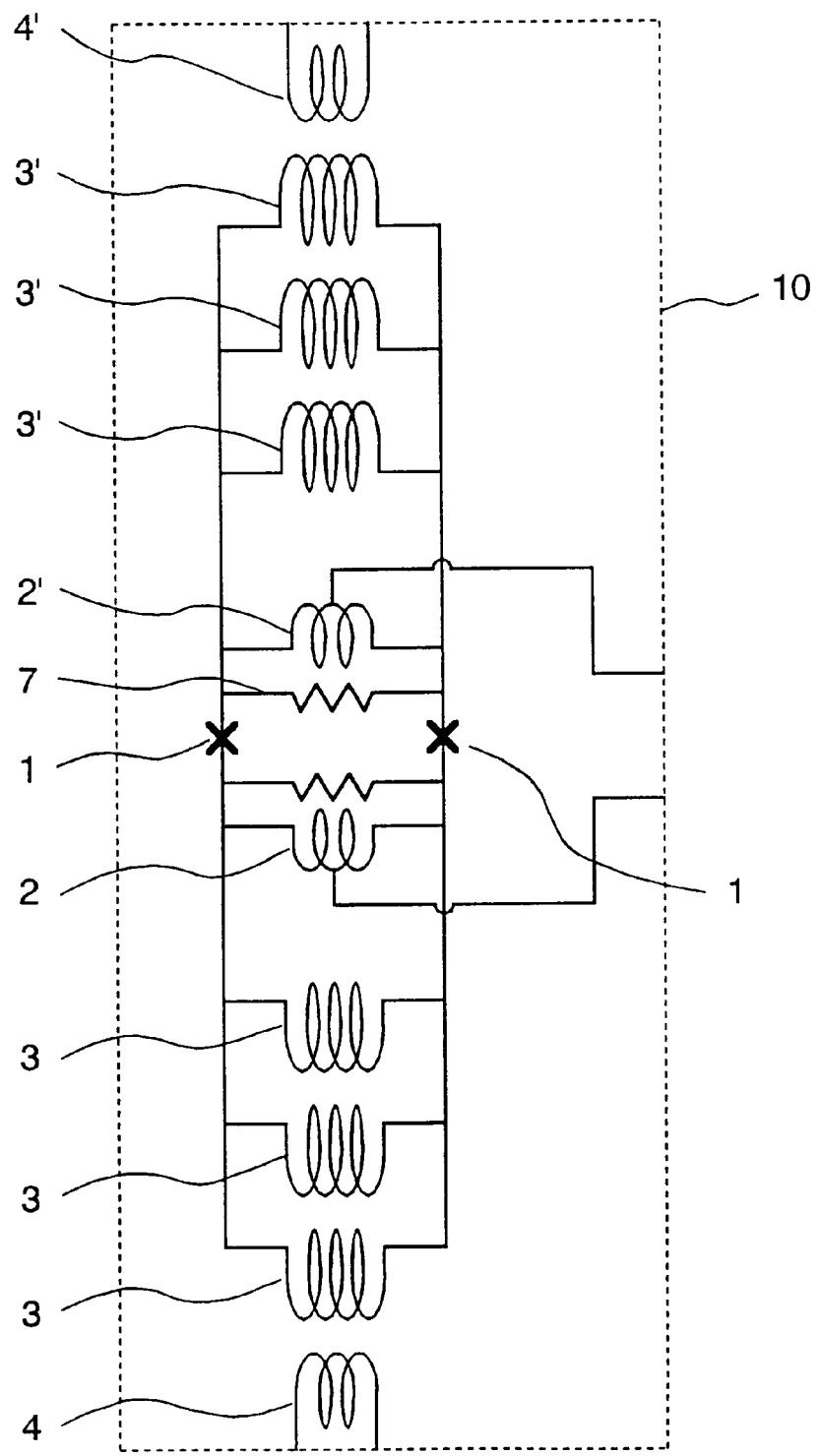
FIG. 2 is a diagram showing an equivalent circuit of another embodiment of the invention.

FIG. 2 shows another embodiment of the invention. According to the construction of the embodiment, in a manner similar to the construction shown in FIG. 1, a plurality of pickup coils 3, 3' (three each in FIG. 2) are parallelly connected to the SQUID. In a manner similar to the embodiment shown in FIG. 1, there are effects such that the inductance $L_p$ of each of the pickup coils 3, 3' is reduced and the magnetic field detection area $A_{eff}$ of the detection coil expressed by $A_p(L_c/L_p)$ is enlarged.

Figure 9:
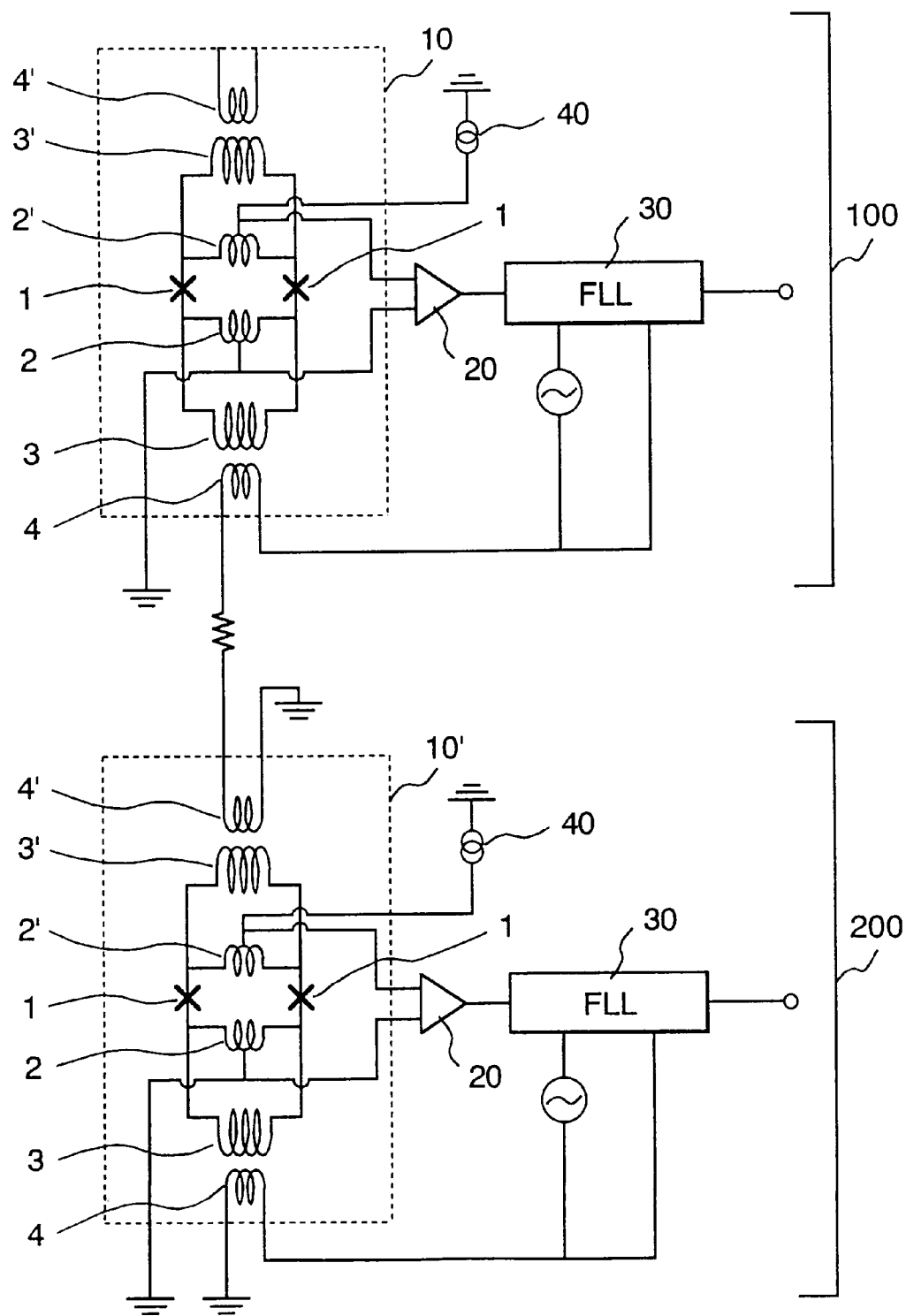
FIG. 9 is a diagram showing an example of an equivalent circuit of a magnetic gradiometer of the invention.
Figure 10:
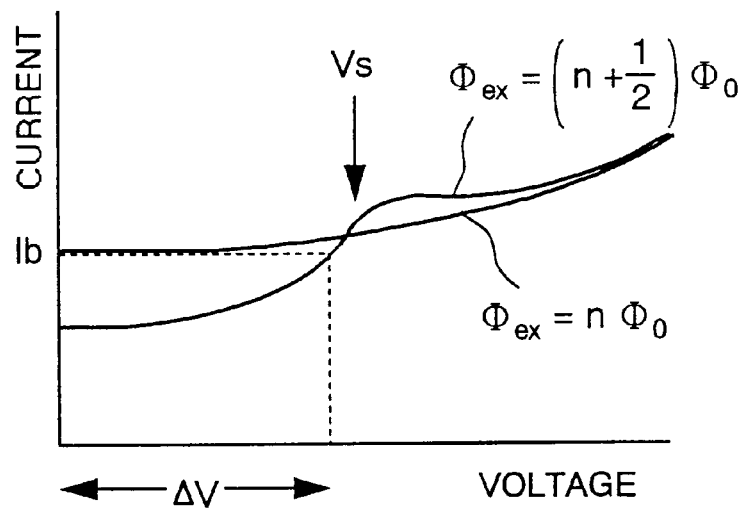
FIG. 10 is a diagram illustrating an operation of a SQUID.
Figure 11:
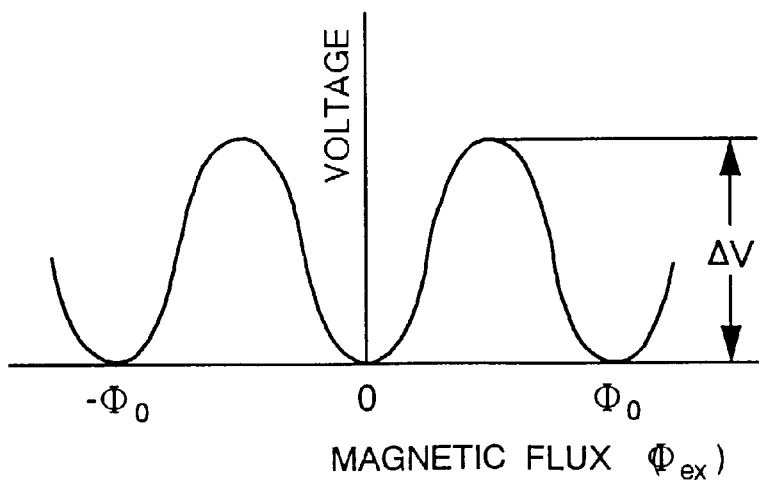
FIG. 11 is a diagram illustrating an operation of a SQUID.

FIG. 9 shows an embodiment of a magnetic gradiometer obtained by applying the invention to the gradiometer described in "Review of Scientific Instrument", Vol. 65, No. 12, pp. 3814 to 3819. In a magnetometer 100 for noise detection and a magnetometer 200 for signal detection, substrates 10, 10' each on which the pickup coils 3, 3' and the SQUID are integrally formed are arranged in parallel and the substrate 10' of the magnetometer 200 for signal detection is arranged near a target to be measured, for example, the skull of a human. By applying a feedback current of the magnetometer 100 for noise detection to the feedback coil 4 and simultaneously to feedback coil 4' of the magnetometer 200 for signal detection, a feedback flux is also introduced to the pickup coil 3' of the magnetometer 200 for signal detection, thereby eliminating noise magnetic fields of the magnetometer 200 for signal detection. A signal in which environment noises are reduced and an S/N ratio is improved can be obtained as an output of the magnetometer 200 for signal detection in a manner similar to a conventionally well-known case using a differential coil.

In addition to the regular feedback coil 4, the magnetometer 200 for signal detection needs a coil 4' for introducing the feedback magnetic flux of the magnetometer 100 for noise detection. In the constructions of the substrate shown in FIGS. 3 and 4, since there are two coils corresponding to the feedback coils 4, 4', the construction of the substrate shown in FIGS. 3 and 4 can be used as it is for the magnetometer 2010 for signal detection. In FIG. 9, reference numeral 20 denotes an amplifier, reference numeral 30 denotes a Flux-Locked-Loop circuit, and reference numeral 40 denotes a bias current source. Generally, in a SQUID magnetometer using the high-Tc superconductor, since connection of the superconductors is difficult, it is difficult to construct a well known atial type gradiometer which detects the special difference in the detected magnetic field direction. By using the construction shown in FIG. 9, the atial gradiometer can be easily constructed by the high-Tc SQUID magnetometer without connection of the superconductors.

In biomagnetic field measuring equipments, tens of magnetometer are arranged on the surface of the body in order to estimate the impulse conducting system of the heart or active positions of cranial nerves. By using a plurality of the above magnetometers or gradiometers, a biomagnetic field measuring device having higher sensitivity, that is, lower magnetic field noise of the pickup coil input conversion as compared with the conventional technique can be realized.

When the SQUID and the pickup coils of the SQUID magnetometer are integrally formed by using the one-layer of the high-Tc superconductive film on the same substrate, two pickup coils each of which occupies half the area of the substrate are used to enlarge the magnetic field detection area of the pickup coils, thereby improving the sensitivity of the SQUID magnetometer (improvement of the sensitivity denotes the reduction of the magnetic field noises of the pickup coil input conversion).

What is claimed is:

1. A SQUID integrated with pickup coils comprising:
   a SQUID ring formed by connecting two Josephson junctions by two first superconductors; and
   at least one pair of separate second superconductors, one of the at least one pair being connected in parallel to one of the first two superconductors and the other of the at least one pair being connected in parallel to the other of the first two superconductors so as to form a plurality of closed superconductive circuits utilized as pickup coils for detecting a magnetic field.

2. A SQUID integrated with pickup coils according to claim 1, wherein a plurality of pairs of separated second superconductors are provided, one of each pair being connected in parallel to the one of the two first superconductors and the other of each pair being connected in parallel to the other of the two first superconductors.

3. A SQUID integrated with pickup coils comprising:
   a SQUID ring formed by connecting two Josephson junctions by two first superconductors;
   at least one pair of separate second superconductors, one of the at least one pair being connected in parallel to one of the first two superconductors and the other of the at least one pair being connected in parallel to the other of the first two superconductors so as to form a plurality of closed superconductive circuits utilized as pickup coils for detecting a magnetic field; and
   a third superconductor which is magnetically coupled with at least one of the plurality of closed superconductive circuits and is used as a feedback coil.

4. A SQUID integrated with pickup coils comprising:
- a SQUID ring formed by connecting two Josephson junctions by two first superconductors;
- at least one pair of separate second superconductors, one of the at least one pair being connected in parallel to one of the first two superconductors and the other of the at least one pair being connected in parallel to the other of the first two superconductors so as to form a plurality of closed superconductive circuits utilized as pickup coils for detecting a magnetic field;
- a third superconductor which is magnetically coupled with at least one of the plurality of closed superconductive circuits and is used as a first feedback coil; and
- a fourth superconductor which is magnetically coupled with at least another one of the plurality of closed superconductive circuits and is used as a second feedback coil.

5. A SQUID integrated with pickup coils comprising:
- a SQUID ring formed by connecting two Josephson junctions by two first superconductors; and
- at least one pair of separate second superconductors, one of the at least one pair being connected in parallel to one of the first two superconductors and the other of the at least one pair being connected in parallel to the other of the first two superconductors so as to form a plurality of closed superconductive circuits utilized as pickup coils for detecting a magnetic field;
- wherein the at least one pair of separate second superconductors and said SQUID ring are formed in a thin superconductive film on a single substrate.

6. A SQUID integrated with pickup coils according to claim 5, wherein the thin superconductive film is a one layer film.

7. A SQUID integrated with pickup coils according to claim 5, wherein said two first superconductors and the at least one pair of second superconductors and said SQUID ring are formed by a high-Tc superconductive film having superconductive characteristics at an absolute temperature of 77 Kelvin.

8. A SQUID integrated with pickup coils according to claim 5, wherein a hole part of the SQUID ring includes a center of a surface of the substrate and has a symmetrical shape with respect to a line including the center of the surface of the substrate face.

9. A SQUID integrated with pickup coils according to claim 5, wherein a hole part of the SQUID ring includes a center of a surface of the substrate and has a symmetrical shape with respect to a center of a surface of the substrate.

10. A SQUID integrated with pickup coils according to claim 5, wherein the substrate is a bicrystal substrate having a misalignment in a crystal direction and the Josephson junctions are formed on a bicrystal line as a crossed line between a misalignment face in the crystal direction and a surface of the substrate.

11. A SQUID integrated with pickup coils according to claim 5, wherein the substrate has a step on a surface and the Josephson functions are formed on the step.

12. A SQUID integrated with pickup coils according to claim 5, wherein the substrate is a bicrystal substrate having a misalignment in a crystal direction and the Josephson junctions are formed on a bicrystal line as a crossed line between a misalignment face in the crystal direction and a surface of the substrate, and the SQUID ring and the pickup coils have a symmetrical shape with respect to the bicrystal line.

13. A SQUID integrated with pickup coils according to claim 5, wherein the substrate has a step on a surface and the Josephson junctions are formed on the step, and wherein the SQUID ring and the pickup coils have a symmetrical shape with respect to a step line defined as an angle of the step.

14. A magnetometer using the SQUID integrated with pickup coils according to claim 3, wherein the feedback coil is connected to a flux-locked loop and feeds back a feedback magnetic flux of the flux-locked loop to at least one of the pickup coils.

15. A magnetic gradiometer having first and second magnetometers each constructed by the SQUID integrated with pickup coils according to claim 4, wherein each of the first feedback coils of the first and second magnetometers is connected to a flux-locked loop and feeds back a feedback magnetic flux of the flux-locked loop to at least one of the pickup coils of the first and second magnetometers, and wherein the first feedback coil of the first magnetometer is serially connected to the second feedback coil of the second magnetometer.

16. A SQUID integrated with pickup coils comprising:
- a SQUID ring formed by connecting two Josephson junctions by two first superconductors; and
- at least one pair of separate second superconductors, one of the at least one pair being connected in parallel to one of the first two superconductors and the other of the at least one pair being connected in parallel to the other of the first two superconductors so as to form a plurality of closed superconductive circuits utilized as pickup coils for detecting a magnetic field;
- wherein the pickup coils each occupy about one half of an area of a substrate on which said SQUID ring and the at least one pair of separate second superconductors are formed; and
- wherein said SQUID ring and the pickup coils are formed symmetrically with respect to a line connecting the two Josephson junctions.

* * * * *